(12) United States Patent
Chen et al.

(10) Patent No.: US 10,874,034 B1
(45) Date of Patent: Dec. 22, 2020

(54) PUMP DRIVEN LIQUID COOLING MODULE WITH TOWER FINS

(71) Applicant: Facebook, Inc., Menlo Park, CA (US)

(72) Inventors: Cheng Chen, Fremont, CA (US); Saket Suhas Karajgikar, Fremont, CA (US)

(73) Assignee: Facebook, Inc., Menlo Park, CA (US)

( * ) Notice: Subject to any disclaimer, the term of this patent is extended or adjusted under 35 U.S.C. 154(b) by 0 days.

(21) Appl. No.: 16/674,860

(22) Filed: Nov. 5, 2019

(51) Int. Cl.
*H05K 7/20* (2006.01)
*H01L 23/473* (2006.01)

(52) U.S. Cl.
CPC ....... *H05K 7/20772* (2013.01); *H01L 23/473* (2013.01); *H05K 7/20254* (2013.01); *H05K 7/20263* (2013.01); *H05K 7/20272* (2013.01)

(58) Field of Classification Search
None
See application file for complete search history.

(56) References Cited

U.S. PATENT DOCUMENTS

| | | | | |
|---|---|---|---|---|
| 7,021,367 B2* | 4/2006 | Oikawa | ................... | F28D 15/02 165/185 |
| 8,432,695 B2* | 4/2013 | Yoshikawa | ........... | H01L 23/473 361/709 |
| 2006/0278372 A1* | 12/2006 | Lai | ............................ | F28F 3/12 165/104.33 |
| 2007/0053152 A1* | 3/2007 | Ouyang | ..................... | G06F 1/20 361/679.47 |
| 2007/0089859 A1* | 4/2007 | Wei | ....................... | H01L 23/467 165/80.4 |
| 2007/0235180 A1* | 10/2007 | Ouyang | ................. | G05D 23/20 165/287 |
| 2011/0272120 A1* | 11/2011 | Joshi | ................... | F28D 1/05366 165/104.13 |
| 2017/0234623 A1* | 8/2017 | Fried | .................. | H05K 7/20809 165/104.26 |

* cited by examiner

*Primary Examiner* — Courtney L Smith
(74) *Attorney, Agent, or Firm* — Van Pelt, Yi & James LLP

(57) ABSTRACT

A pump driven liquid cooling device with tower fins is disclosed. The device includes a thermal interface component configured to be coupled to an electronic component to be cooled via the thermal interface component. The device further includes at least one coolant pipe coupled to the thermal interface component. The device includes a local heat exchanger coupled to the at least one coolant pipe and comprising a plurality of stacked horizontal fins. The device includes a local coolant pump configured to pump a liquid coolant through the at least one coolant pipe in a local closed loop.

18 Claims, 5 Drawing Sheets

PUMP DRIVEN LIQUID COOLING MODULE WITH TOWER FINS

BACKGROUND OF THE INVENTION

Computer cooling is used to remove the waste heat produced by computer components, to keep components within permissible operating temperature limits. Components that are susceptible to temporary malfunction or permanent failure if overheated include integrated circuits, such as central processing units (CPUs), graphics processing units (GPUs), application-specific integrated circuits (ASICs), or field-programmable gate arrays (FPGAs), other chip modules, and the like. For example, server racks in datacenters are increasingly powered by high power chips such as GPUs, CPUs, or Artificial intelligence (AI) chips, to handle demanding workloads, thereby causing the heat generation and power dissipation of the server racks to soar. However, the cooling performance of traditional cooling techniques is often limited and the cost is high.

BRIEF DESCRIPTION OF THE DRAWINGS

Various embodiments of the invention are disclosed in the following detailed description and the accompanying drawings.

DETAILED DESCRIPTION

Figure 1:
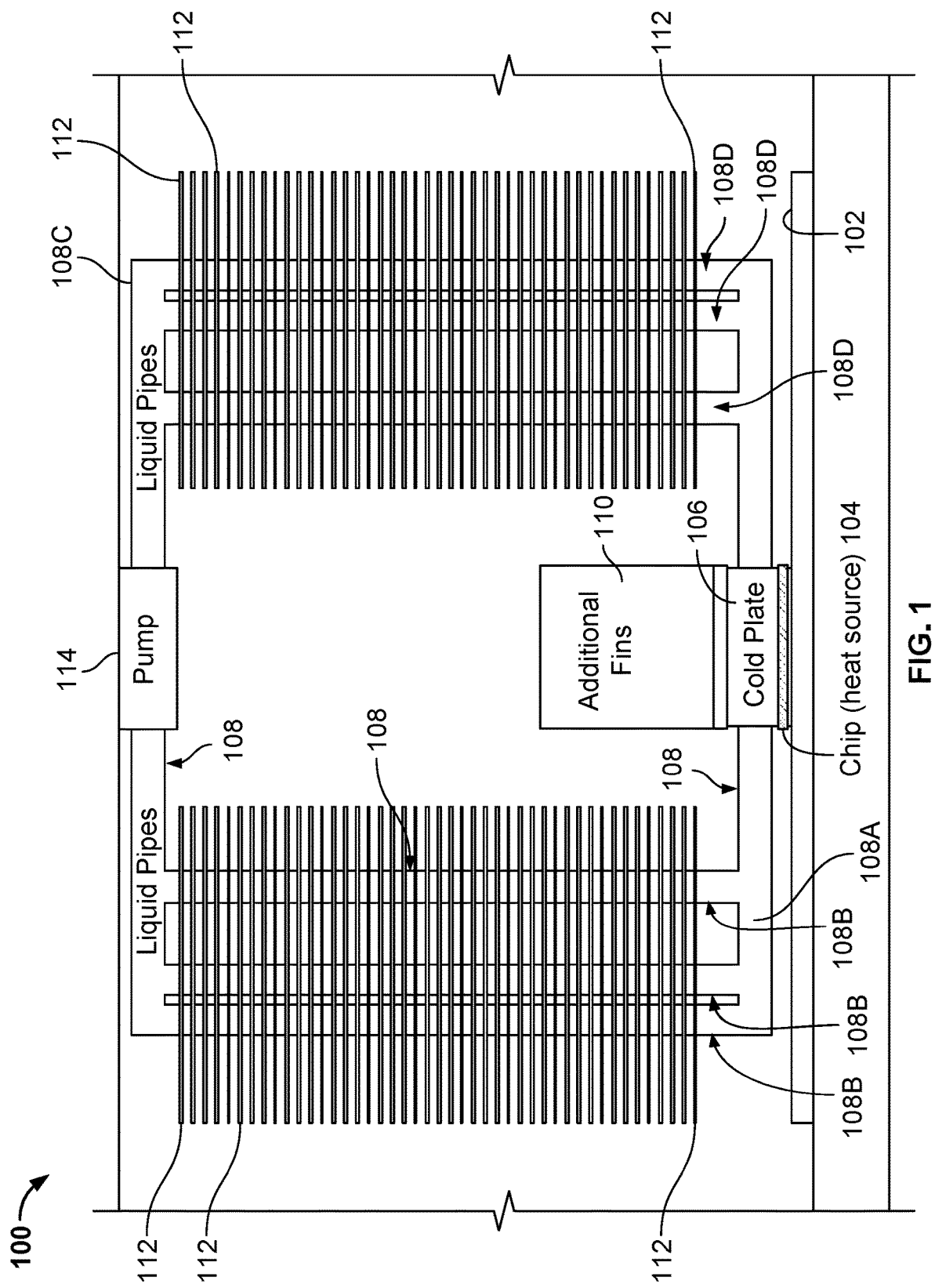
FIG. 1 illustrates a side view of an exemplary embodiment of a pump-driven, single-phase, chip module cooling system 100 with liquid flow pipes and heat sinks.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Heat pipes are extensively used in many computer systems to move heat away from high power components such as CPUs, GPUs, ASICs, or chipsets to heat sinks where thermal energy may be dissipated. A heat pipe is a hollow tube containing a heat transfer liquid. At the hot end of the heat pipe, the heat transfer liquid is in contact with a thermally conductive solid surface, and the liquid absorbs the heat and changes phase from a liquid to a vapor. The vapor travels to the other end of the tube coupled to a heat sink, where the vapor condenses back to a liquid, giving up its latent heat. The liquid then returns to the hot end of the tube by gravity or capillary action and repeats the cycle. Heat pipe cooling systems are passive devices that require no external power or control to perform their function. It is a two-phase technique as the heat transfer liquid changes phase from a liquid to a vapor, and vice-versa.

However, these traditional passive two-phase cooling techniques using heat pipes have many limitations. One of the limitations is that heat pipes become increasingly inefficient in transferring heat over longer distances. Another limitation is the maximum amount of power the heat pipe is capable of transferring; typically, a passive two-phase heat pipe cooling system for cooling a chip module has a cooling limit of approximately 450 Watts before the heatsink becomes bulky or too large for the socket underneath to support it.

Figure 2:
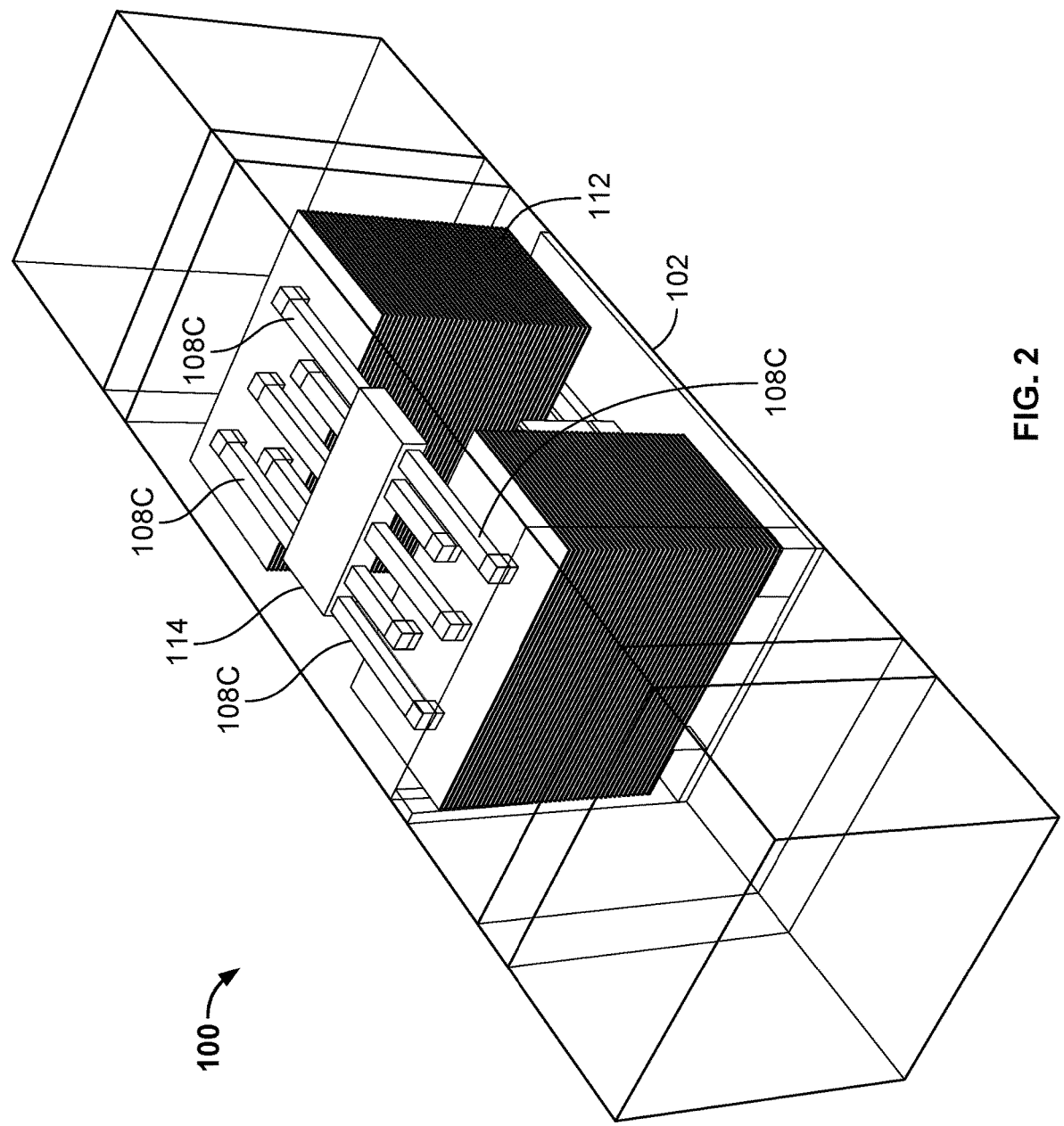
FIG. 2 illustrates an isometric view of the exemplary embodiment of the pump-driven, single-phase, chip module cooling system 100
Figure 3:
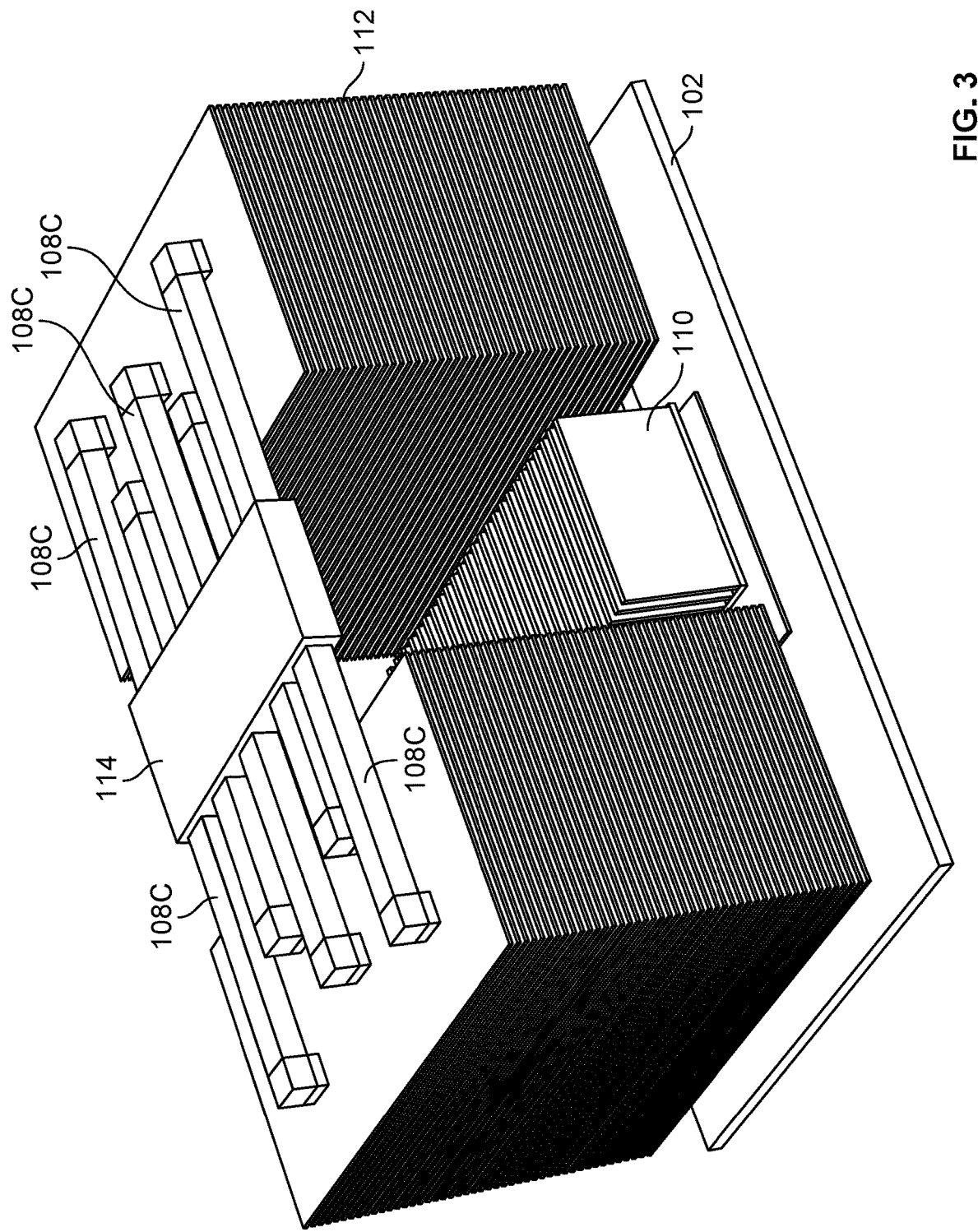
FIG. 3 illustrates another view of the exemplary embodiment of the pump-driven, single-phase, chip module cooling system 100.
Figure 4:
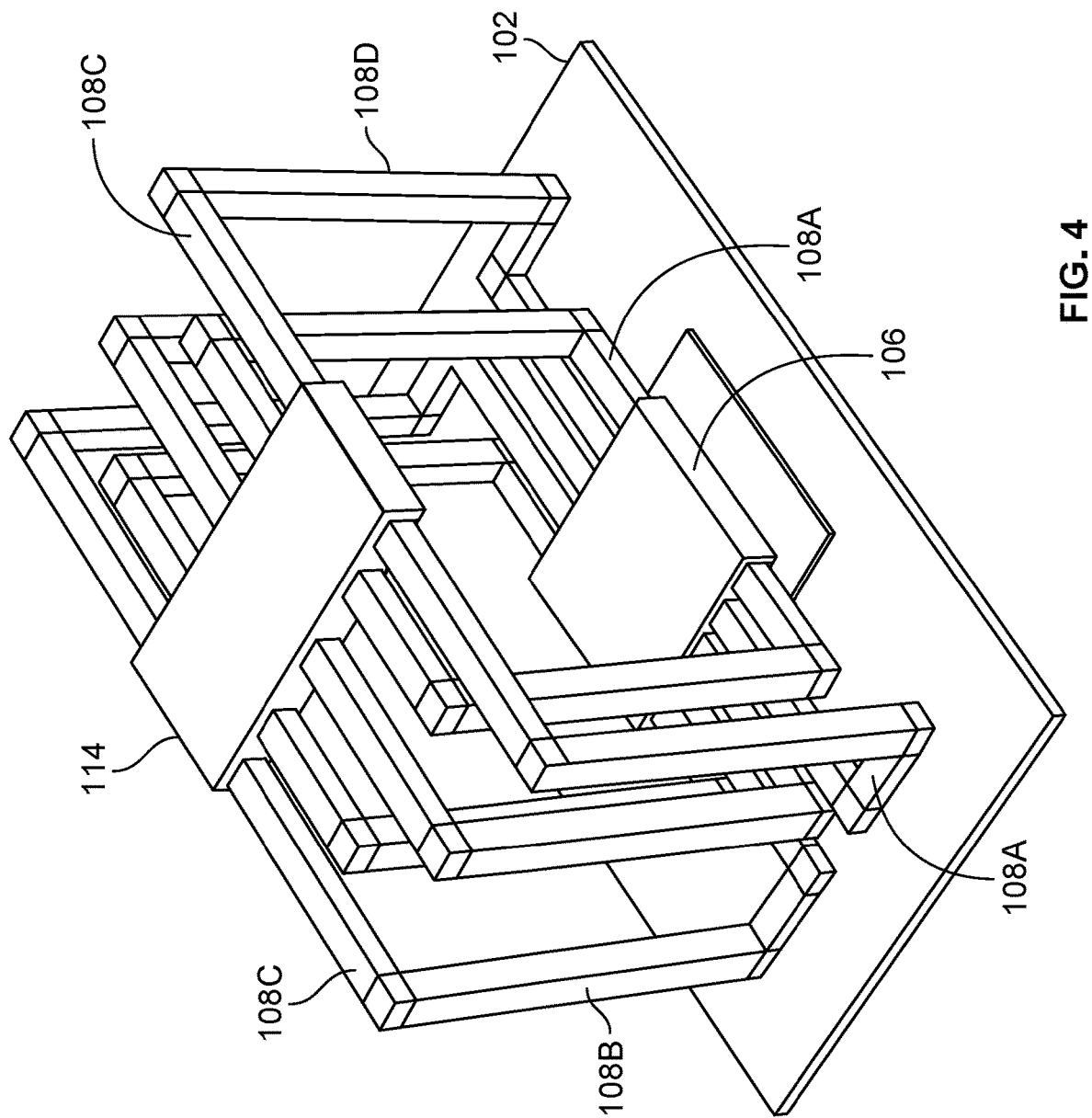
FIG. 4 illustrates another view of the exemplary embodiment of the pump-driven, single-phase, chip module cooling system 100.
Figure 5:
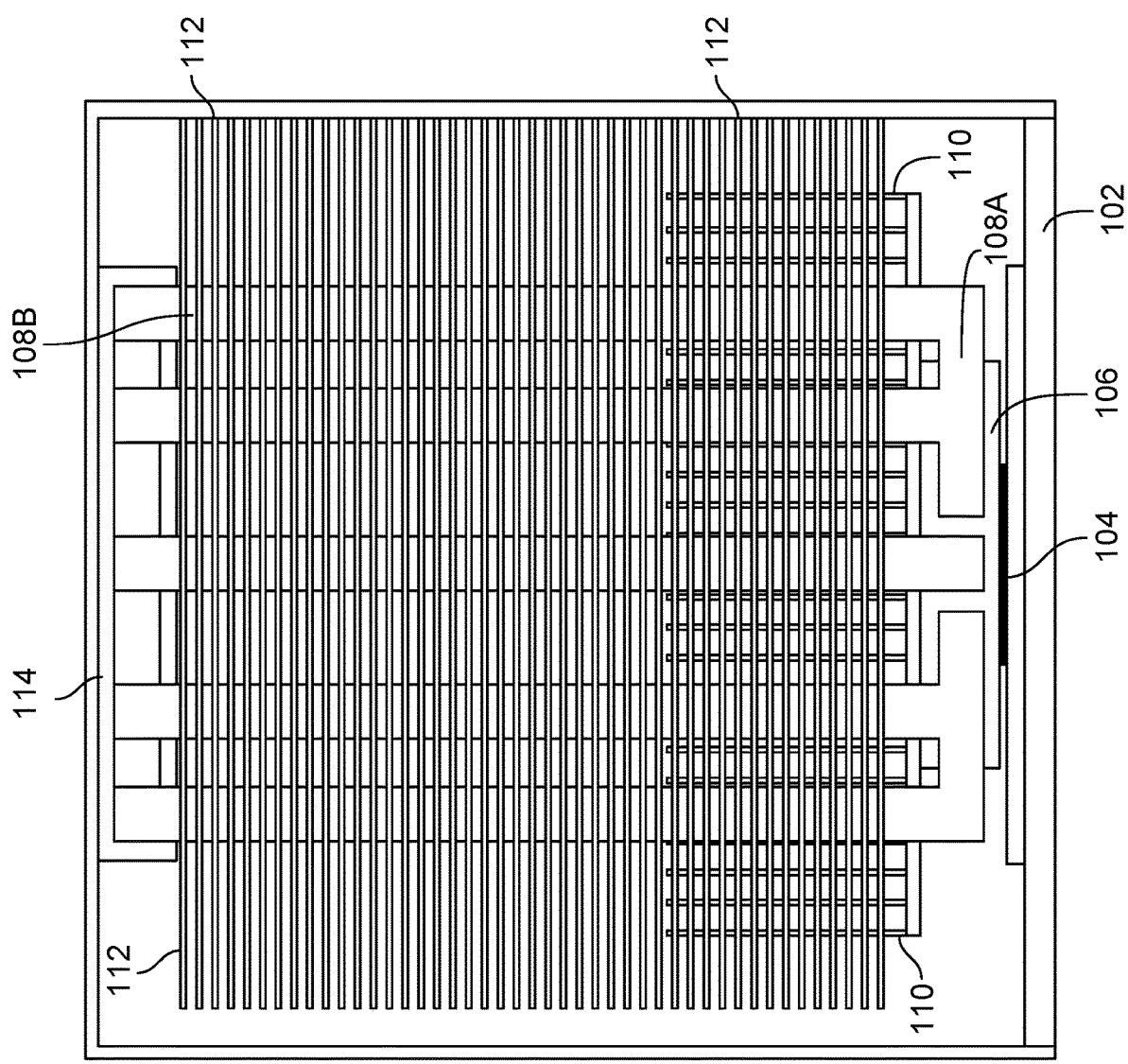
FIG. 5 illustrates another side view of the exemplary embodiment of the pump-driven, single-phase, chip module cooling system 100.

FIG. 1 illustrates a side view of an exemplary embodiment of a pump-driven, single-phase, chip module cooling system 100 with liquid flow pipes and heat sinks. FIG. 2 illustrates an isometric view of the exemplary embodiment of the pump-driven, single-phase, chip module cooling system 100. FIG. 3 illustrates another view of the exemplary embodiment of the pump-driven, single-phase, chip module cooling system 100. FIG. 4 illustrates another view of the exemplary embodiment of the pump-driven, single-phase, chip module cooling system 100. In this view, some of the components are not shown to reveal the liquid flow pipes. FIG. 5 illustrates another side view of the exemplary embodiment of the pump-driven, single-phase, chip module cooling system 100.

In some embodiments, chip module cooling system 100 may be used as a cooling system for an OAM (Open Accelerator Module) chip module. In some embodiments, chip module cooling system 100 may be used as a cooling system for electronic components, such as integrated circuits including CPUs, GPUs, ASICs, FPGAs, AI chips, and the like. In some embodiments, chip module cooling system 100 may be used for cooling the electronic devices mounted on one or more printed circuit boards (PCBs) installed in a server chassis. For example, chip module cooling system 100 may be mounted on a chip on a PCB that is housed in a tray or drawer of a serviceable front-loading server chassis. The height and dimensions of chip module cooling system 100 are limited such that once mounted on the PCB, the tray or drawer housing the PCB may slide in and out of the server chassis when the service chassis is being serviced.

As shown in FIG. 1, chip module cooling system 100 includes a thermal interface component 106. Thermal interface component 106 is configured to be coupled to an electronic component 104 mounted on a PCB 102, such that electronic component 104 may be cooled via thermal interface component 106. Thermal interface component 106 provides an interface surface in contact with the electronic component 104. For example, thermal interface component 106 is placed on top of the electronic component 104 that requires cooling, and the lower flat surface of thermal interface component 106 provides an interface surface in contact with the electronic component 104.

In some embodiments, thermal interface component 106 is a cold plate. In some embodiments, thermal interface component 106 comprises a metal block. For example, the material forming thermal interface component 106 may include any metals, such as aluminum, copper, silver, or silver copper alloys. In some embodiments, thermal interface component 106 includes one or more inlets and one or more outlets. The inlets and outlets direct a liquid coolant to flow in and out of one or more internal channels that direct the liquid coolant to flow through thermal interface component 106. For example, thermal interface component 106 may include a plurality of micro-channels that wind through the thermal interface component 106. In some embodiments, the liquid coolant may include water, inhibited glycol and water solutions, dielectric fluids, custom heat transfer fluids, antifreeze, and the like. Thermal interface component 106 absorbs and dissipates the heat from the electronic component 104 to the liquid coolant.

Chip module cooling system 100 further includes at least one liquid pipe 108 coupled to thermal interface component 106. For example, coolant pipe 108 is coupled to the one or more inlets and one or more outlets of thermal interface component 106. Coolant pipe 108 directs the liquid coolant in and out of thermal interface component 106 and circulates the liquid coolant to the rest of the chip module cooling system 100.

In some embodiments, coolant pipe 108 may include a plurality of portions that form a closed loop. As shown in FIG. 1, coolant pipe 108 includes one or more horizontal portions 108A that run substantially parallel to PCB 102 and direct the liquid coolant in and out of thermal interface component 106. Coolant pipe 108 may further include one or more vertical portions 108B that branch out from the one or more horizontal portions 108A. The one or more vertical portions 108B of coolant pipe 108 run substantially perpendicular to the electronic component 104 and the PCB 102, and direct the liquid coolant upwards to the rest of the chip module cooling system 100. Coolant pipe 108 may further include one or more horizontal portions 108C (see both FIG. 1 and FIG. 2) that branch out from the one or more vertical portions 108B. The one or more horizontal portions 108C of coolant pipe 108 run substantially parallel to PCB 102 and direct the liquid coolant in and out of a heat pump 114 that pumps the liquid coolant to circulate through the closed loop. Coolant pipe 108 may further include one or more vertical portions 108D that branch out from the one or more horizontal portions 108C. The one or more vertical portions 108D of coolant pipe 108 run substantially perpendicular to PCB 102, directing the liquid coolant downwards and merging with the one or more horizontal portions 108A.

Chip module cooling system 100 further includes one or more local heat exchangers 112 coupled to the coolant pipe 108. Each heat exchanger 112 transfers heat between two fluids, dissipating heat from one fluid to another fluid. For example, each heat exchanger 112 transfers heat between the liquid coolant inside coolant pipe 108 and the air that flows past the heat exchanger 112. In some embodiments, a system fan may be used to blow air past the heat exchanger 112. In some embodiments, each heat exchanger 112 is a heat sink that includes a plurality of fins with large surface area to dissipate the heat while maintaining good airflow through the heat sink. In some embodiments, each heat exchanger 112 is a stacked fin heat sink that includes a plurality of stacked fins in a tower. For example, as shown in FIG. 1, a stack of horizontal planar fins 112 are coupled to the one or more vertical portions 108B of coolant pipe 108. Similarly, a stack of horizontal fins 112 are coupled to the one or more vertical portions 108D of coolant pipe 108. Each fin extends from one or more vertical portions (108B or 108D) of coolant pipe 108 to increase the rate of heat transfer to the environment by increasing convection. The fins in one stack of horizontal fins are stacked on top of each other to transfer heat from one or more vertical portions (108B or 108D) of coolant pipe 108 at different heights. In some embodiments, the heat exchangers 112 are formed using a material with a high thermal conductivity value, such as copper, aluminum, or aluminum alloy.

Chip module cooling system 100 further includes one or more local coolant pumps 114 configured to pump the liquid coolant through the coolant pipe 108 in a local closed loop within the system. As shown in FIG. 1 and FIG. 2, the one or more horizontal portions 108C of coolant pipe 108 run substantially parallel to PCB 102 and direct the liquid coolant in and out of the local coolant pump 114 that pumps the liquid coolant to circulate through the closed loop. In some embodiments, a liquid tank or reservoir may be coupled to the local coolant pump 114. In some embodiments, the coolant pump 114 is powered by a power source on the PCB 102. In some embodiments, control and diagnostic information of the coolant pump 114 may be communicated between the coolant pump 114 and the PCB 102. For example, the control and diagnostic information may include the "ON" and "OFF" signals or status. The control and diagnostic information may include the duty cycle and the rotations per minute (RPM) of the coolant pump 114.

Chip module cooling system 100, as described above, has liquid coolant flowing in a counter-clockwise direction in the closed loop. However, it should be recognized that chip module cooling system 100 may be configured such that the liquid coolant flows in a clockwise direction as well. The liquid coolant is at the highest temperature when it leaves the thermal interface component 106. As the liquid coolant passes through the heat exchangers 112, its temperature is continuously lowered until it travels back to the thermal interface component 106.

In some embodiments, chip module cooling system 100 further includes one or more local heat exchangers 110 coupled to the top surface of the thermal interface component 106. In some embodiments, heat exchanger 110 is a heat sink that includes a plurality of fins with large surface area to dissipate the heat while maintaining good airflow through the heat sink. In some embodiments, as shown in FIG. 3 and FIG. 5, each heat exchanger 110 is a stacked fin heat sink that includes a plurality of stacked vertical fins.

Chip module cooling system 100 has many advantages over other techniques. All the components of the liquid cooling loop form a single pre-assembled module that is collocated with the chip module on the PCB, thereby increasing the overall efficiency and lowering the operation cost, including the cost of powering the system and the cost of generating the airflow for the system. As a single module, chip module cooling system 100 may be easily mounted as a single assembly onto the chip module without the need to combine and assemble the parts individually, thereby reducing the assembly cost. In traditional cooling techniques, redesigning the system for future generations of high power modules requires significant investment on a rack level or infrastructure level retrofit. In contrast, as a single module, chip module cooling system 100 may be easily redesigned for future generations of high power chip modules with minimal increase in cost.

In some other techniques, a radiator is used and is located far away from the cold plate, and as a result the system requires extra space. In contrast, as a single module, chip module cooling system 100 is compact in size. In addition, radiator designs are often not very flexible and difficult to optimize. Chip module cooling system 100 uses vertical liquid flow coolant pipes to spread heat vertically and makes the best use of space for cooling. Furthermore, the heat spreading mechanism of traditional heat sinks has diminishing returns as the height of the heat sink increases. For example, a passive two-phase coolant pipe cooling system for cooling a chip module has a cooling limit of 450 Watts. Chip module cooling system 100 does not have such a limitation and can provide continuous performance gain as the module is scaled taller. For example, the module may be 90 millimeters (mm) or more in height without any performance loss and the cooling limit is beyond 500 to 550 Watts.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A device, comprising:
a thermal interface component configured to be coupled to an electronic component to be cooled via the thermal interface component;
at least one coolant pipe coupled to the thermal interface component, wherein the at least one coolant pipe comprises a plurality of portions of the at least one coolant pipe that form a local closed loop;
a local heat exchanger coupled to the at least one coolant pipe and comprising a plurality of stacked horizontal fins; and
a local coolant pump configured to pump a liquid coolant through the at least one coolant pipe in the local closed loop, wherein the plurality of portions of the at least one coolant pipe comprises one or more portions directing the liquid coolant upwards and away from the thermal interface component and the electronic component, and wherein the plurality of stacked horizontal fins is coupled to the one or more portions directing the liquid coolant upwards and away from the thermal interface component and the electronic component.

2. The device of claim 1, wherein the electronic component is mounted on a printed circuit board in a server chassis.

3. The device of claim 1, wherein the thermal interface component comprises a lower flat interface surface in contact with the electronic component and absorbing heat from the electronic component.

4. The device of claim 1, wherein the thermal interface component comprises a cold plate formed with a metal.

5. The device of claim 1, wherein the thermal interface component comprises a cold plate comprising one or more inlets and one or more outlets directing the liquid coolant to flow in and out of one or more internal channels that direct the liquid coolant to flow through the thermal interface component.

6. The device of claim 5, wherein the one or more internal channels comprise a plurality of micro-channels that winds through the thermal interface component.

7. The device of claim 1, wherein the one or more portions directing the liquid coolant upwards and away from the thermal interface component and the electronic component comprise one or more vertical portions running substantially perpendicular to the electronic component.

8. The device of claim 1, wherein the plurality of portions of the at least one coolant pipe comprises one or more portions directing the liquid coolant downwards and back to the thermal interface component and the electronic component.

9. The device of claim 8, wherein the plurality of stacked horizontal fins are coupled to the one or more portions directing the liquid coolant downwards and back to the thermal interface component and the electronic component.

10. The device of claim 8, wherein the one or more portions directing the liquid coolant downwards and back to the thermal interface component and the electronic component comprise one or more vertical portions running substantially perpendicular to the electronic component.

11. The device of claim 9, wherein the plurality of portions of the at least one coolant pipe comprises one or more portions directing the liquid coolant substantially horizontally and connecting the one or more portions directing the liquid coolant upwards and away from the thermal interface component and the electronic component with the one or more portions directing the liquid coolant downwards and back to the thermal interface component and the electronic component to form the local closed loop.

12. The device of claim 1, further comprising a reservoir coupled to the local coolant pump.

13. The device of claim 1, wherein the device is preassembled as a single module and collocated with the electronic component.

14. The device of claim 1, wherein the device has a cooling limit above 500 watts.

15. The device of claim 1, wherein the device has a height limit above 90 millimeters.

16. A method, comprising:
providing a thermal interface component configured to be coupled to an electronic component to be cooled via the thermal interface component;
providing at least one coolant pipe coupled to the thermal interface component, wherein the at least one coolant pipe comprises a plurality of portions of the at least one coolant pipe that form a local closed loop;
providing a local heat exchanger coupled to the at least one coolant pipe and comprising a plurality of stacked horizontal fins; and
providing a local coolant pump configured to pump a liquid coolant through the at least one coolant pipe in the local closed loop, wherein the plurality of portions of the at least one coolant pipe comprises one or more portions directing the liquid coolant upwards and away from the thermal interface component and the electronic component, and wherein the plurality of stacked horizontal fins is coupled to the one or more portions directing the liquid coolant upwards and away from the thermal interface component and the electronic component.

17. The method of claim 16, wherein the plurality of portions of the at least one coolant pipe comprises one or more portions directing the liquid coolant downwards and back to the thermal interface component and the electronic component.

18. The method of claim 17, wherein the plurality of stacked horizontal fins are coupled to the one or more portions directing the liquid coolant downwards and back to the thermal interface component and the electronic component.

\* \* \* \* \*